(12) United States Patent
Ju

(10) Patent No.: US 10,177,475 B2
(45) Date of Patent: Jan. 8, 2019

(54) ELECTRICAL CONNECTOR HAVING A METAL MEMBER INJECTION MOLDED IN A BASE AND SIDE WALLS OF AN INSULATING BODY

(71) Applicant: LOTES CO., LTD, Keelung (TW)

(72) Inventor: Ted Ju, Keelung (TW)

(73) Assignee: LOTES CO., LTD, Keelung (TW)

(*) Notice: Subject to any disclaimer, the term of this patent is extended or adjusted under 35 U.S.C. 154(b) by 0 days.

(21) Appl. No.: 15/828,920

(22) Filed: Dec. 1, 2017

(65) Prior Publication Data

US 2018/0198221 A1 Jul. 12, 2018

(30) Foreign Application Priority Data

Jan. 9, 2017 (CN) .................. 2017 2 0019155 U

(51) Int. Cl.
| | |
|---|---|
| *H01R 13/00* | (2006.01) |
| *H01R 12/71* | (2011.01) |
| *H05K 1/02* | (2006.01) |
| *H01R 12/70* | (2011.01) |
| *H01R 13/405* | (2006.01) |
| *H05K 3/34* | (2006.01) |

(52) U.S. Cl.
CPC ....... *H01R 12/716* (2013.01); *H01R 12/7082* (2013.01); *H01R 13/405* (2013.01); *H05K 1/0203* (2013.01); *H05K 3/341* (2013.01)

(58) Field of Classification Search
CPC .... H01R 12/00; H01R 12/716; H01R 13/004; H01R 13/405; H01R 13/635; H01R 13/639; H05K 1/0203; H05K 3/0061; H05K 7/20154

USPC .................. 439/68, 153, 342, 343, 485, 487
See application file for complete search history.

(56) References Cited

U.S. PATENT DOCUMENTS

| | | | | |
|---|---|---|---|---|
| 6,649,834 B1* | 11/2003 | Hsieh | .................... | H01L 23/057 174/527 |
| 6,716,051 B1* | 4/2004 | Zeng | ...................... | H01R 12/88 439/342 |
| 7,595,839 B2* | 9/2009 | Webster | ............... | H04N 5/2253 348/374 |
| 7,717,760 B2* | 5/2010 | Ma | .......................... | H01R 12/89 439/135 |
| 2004/0113049 A1* | 6/2004 | Hsieh | ................ | H01L 27/14618 250/208.1 |

(Continued)

FOREIGN PATENT DOCUMENTS

| | | |
|---|---|---|
| CN | 201000935 Y | 1/2008 |
| CN | 202034567 U | 11/2011 |

*Primary Examiner* — Chandrika Prasad
(74) *Attorney, Agent, or Firm* — Locke Lord LLP; Tim Tingkang Xia, Esq.

(57) ABSTRACT

An electrical connector includes an insulating body, multiple terminals and a metal member. The insulating body has a base and side walls. The base is provided with receiving slots. The side walls are higher than the base, and encircled to form an accommodating space for accommodating a chip module. The terminals are received in the receiving slots. Each terminal has a contacting portion lower than a top surface of the side walls. The contacting portions electrically connect with the chip module. The metal member is injection molded at the side walls and the base to reinforce the structure of the side walls and the base, and preventing the insulating body from warping at a high temperature.

15 Claims, 12 Drawing Sheets

(56) References Cited

U.S. PATENT DOCUMENTS

2005/0215102 A1* 9/2005 Yu .................... H05K 7/1007
439/342
2008/0160806 A1* 7/2008 Ma .................... H01R 12/89
439/153

* cited by examiner

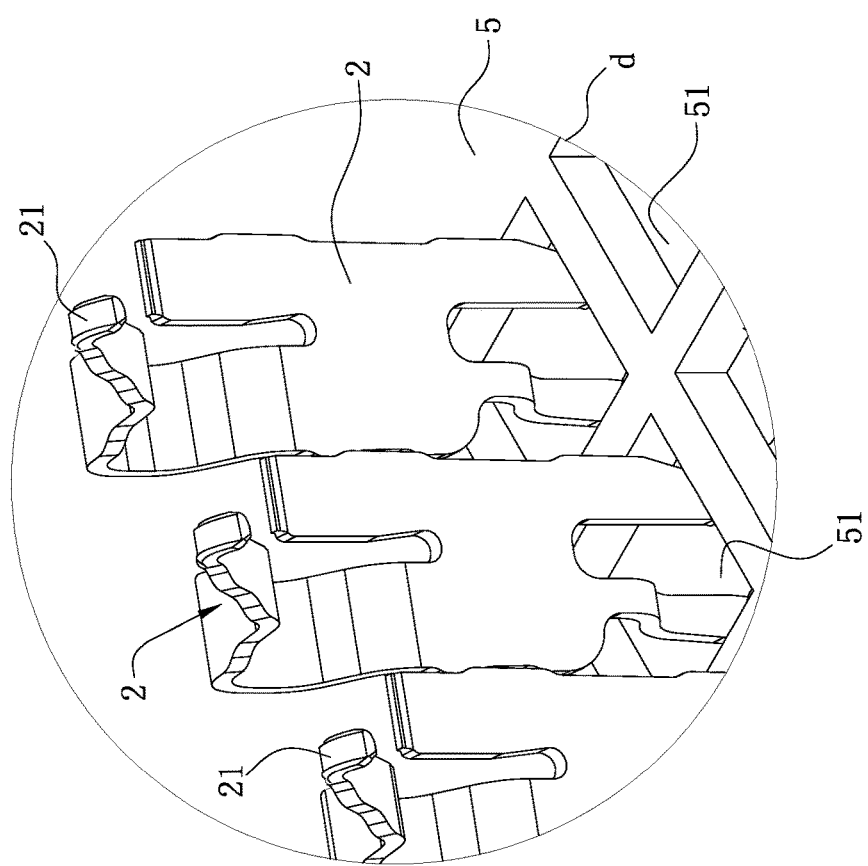

ELECTRICAL CONNECTOR HAVING A METAL MEMBER INJECTION MOLDED IN A BASE AND SIDE WALLS OF AN INSULATING BODY

CROSS-REFERENCE TO RELATED PATENT APPLICATION

This non-provisional application claims priority under 35 U.S.C. § 119(a) on Patent Application No. 201720019155.9 filed in P.R. China on Jan. 9, 2017, the entire contents of which are hereby incorporated by reference.

FIELD OF THE INVENTION

The present invention relates generally to an electrical connector, and more particularly to an electrical connector for being electrically connected to a chip module.

BACKGROUND OF THE INVENTION

The background description provided herein is for the purpose of generally presenting the context of the invention. Work of the presently named inventors, to the extent it is described in this background section, as well as aspects of the description that may not otherwise qualify as prior art at the time of filing, are neither expressly nor impliedly admitted as prior art against the present invention.

Electronic products nowadays have been developed to be lighter and thinner, while chip modules need to process more and more information and have more than thousands of terminals. Correspondingly, an insulating body accommodating the terminals is required to have an area large enough to assemble all the terminals. When the insulating body is soldered to a circuit board through high-temperature heating, due to the large area of the insulating body, the insulating body is prone to warp easily during the high-temperature soldering. The warping causes a part of the terminals in the insulating body to be unable to contact with the circuit board, resulting in incapability of normal work of the chip modules.

Therefore, an unaddressed need exists in the art to address the aforementioned deficiencies and inadequacies.

SUMMARY OF THE INVENTION

Certain aspects of the present invention direct to an electrical connector which achieves high strength of an insulating body and high-temperature warping prevention by providing, by means of injection molding, metal members between side walls, and a reinforcing plate at a base.

In certain embodiments, an electrical connector is used for being electrically connected to a chip module and includes an insulating body having a base. The base is provided with multiple receiving slots and multiple side walls. The side walls are higher than the base. The side walls are encircled to form an accommodating space, and the accommodating space is used for accommodating the chip module. The electrical connector further includes multiple terminals, respectively installed in the multiple receiving slots. Each terminal has a contacting portion lower than a top surface of a side wall, and the contacting portion is used for electrical connection with the chip module. The electrical connector further includes a metal member, injection-molded at the side walls and the base.

In certain embodiments, the side walls are provided with multiple through holes, and the metal member is provided with multiple via holes corresponding to the multiple through holes.

In certain embodiments, the base has multiple protruding portions protruding upwardly from a position adjacent to the side walls. The protruding portions are used for upwardly abutting the chip module, and are disposed between two adjacent via holes.

In certain embodiments, the side walls are higher than the protruding portions.

In certain embodiments, the bottom end of each of the multiple through holes is lower than the top end of each of the protruding portions.

In certain embodiments, the metal member is provided with a base portion, the base portion is injection-molded at the side walls and extends to the base. The base portion bends and extends to form a first bending portion, and the first bending portion is injection-molded at the base.

In certain embodiments, the first bending portion bends and extends upwardly to form a second bending portion underneath a protruding portion, and the second bending portion is injection-molded at the base.

In certain embodiments, the side walls include a first side wall and a second side wall arranged opposite to each other, a reinforcing plate is disposed between the first side wall and the second side wall, and the reinforcing plate is connected with the metal member.

In certain embodiments, the reinforcing plate is provided with a substrate, and the substrate is provided with multiple through pores.

In certain embodiments, the side walls include two first side walls and two second side walls. One of the first side walls is arranged opposite to one of the two second side walls, and the other one of the first side walls is arranged opposite to the other one of the two second side walls. Only one pair of the opposite arranging first and second side walls is provided with a reinforcing plate therebetween.

In certain embodiments, each of the two pairs of the opposite arranging first and second side walls is provided with a reinforcing plate therebetween, and the two reinforcing plates are fixed in an intersecting spliced manner.

In certain embodiments, two sides of the substrate extend upwardly to form a vertical portion, and the vertical portion is soldered to the metal member.

In certain embodiments, multiple metal members are interconnected with one another and injection-molded at the multiple side walls.

In certain embodiments, the base is provided with a bottom plate, the bottom plate is injection-molded at the base and provided with multiple reserved holes corresponding to multiple terminals and multiple receiving slots.

In certain embodiments, the bottom plate is formed with the metal members integrally.

Compared with the related art, in the present invention, the metal members are injection-molded at the side walls and the base, the reinforcing plates are arranged among the metal members, and the reinforcing plates are injection-molded at the base, thereby solving the problems that the terminals cannot contact the circuit board due to the warping of the insulating body when the insulating body is soldered to the circuit board through the high-temperature heating.

These and other aspects of the present invention will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 8B is an enlarged view of a part d in FIG. 5A.

DETAILED DESCRIPTION OF THE INVENTIONS

Figure 1:
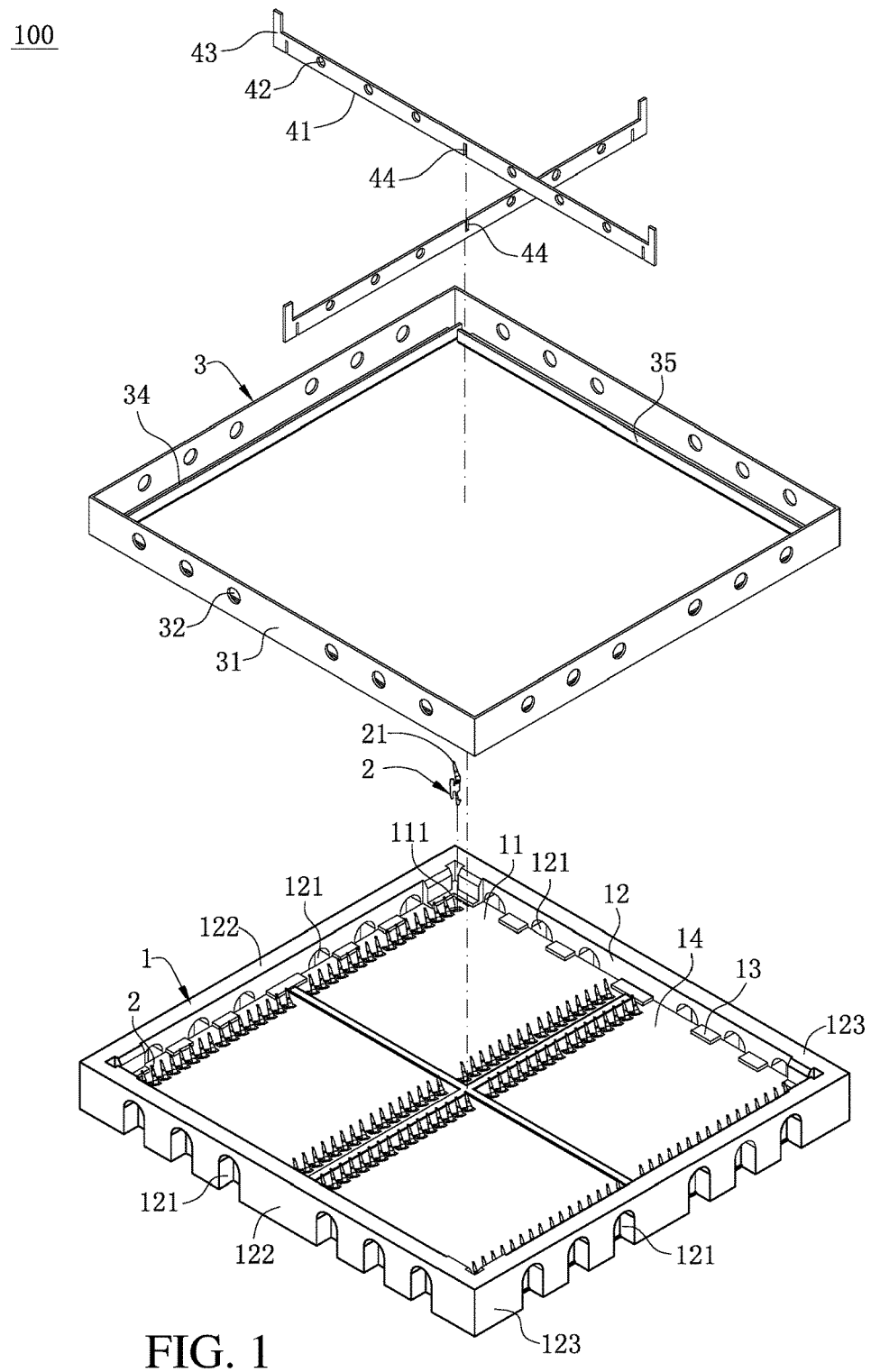
FIG. 1 is a schematic three-dimensional assembly view of an electrical connector according to one embodiment of the present invention.
Figure 2A:
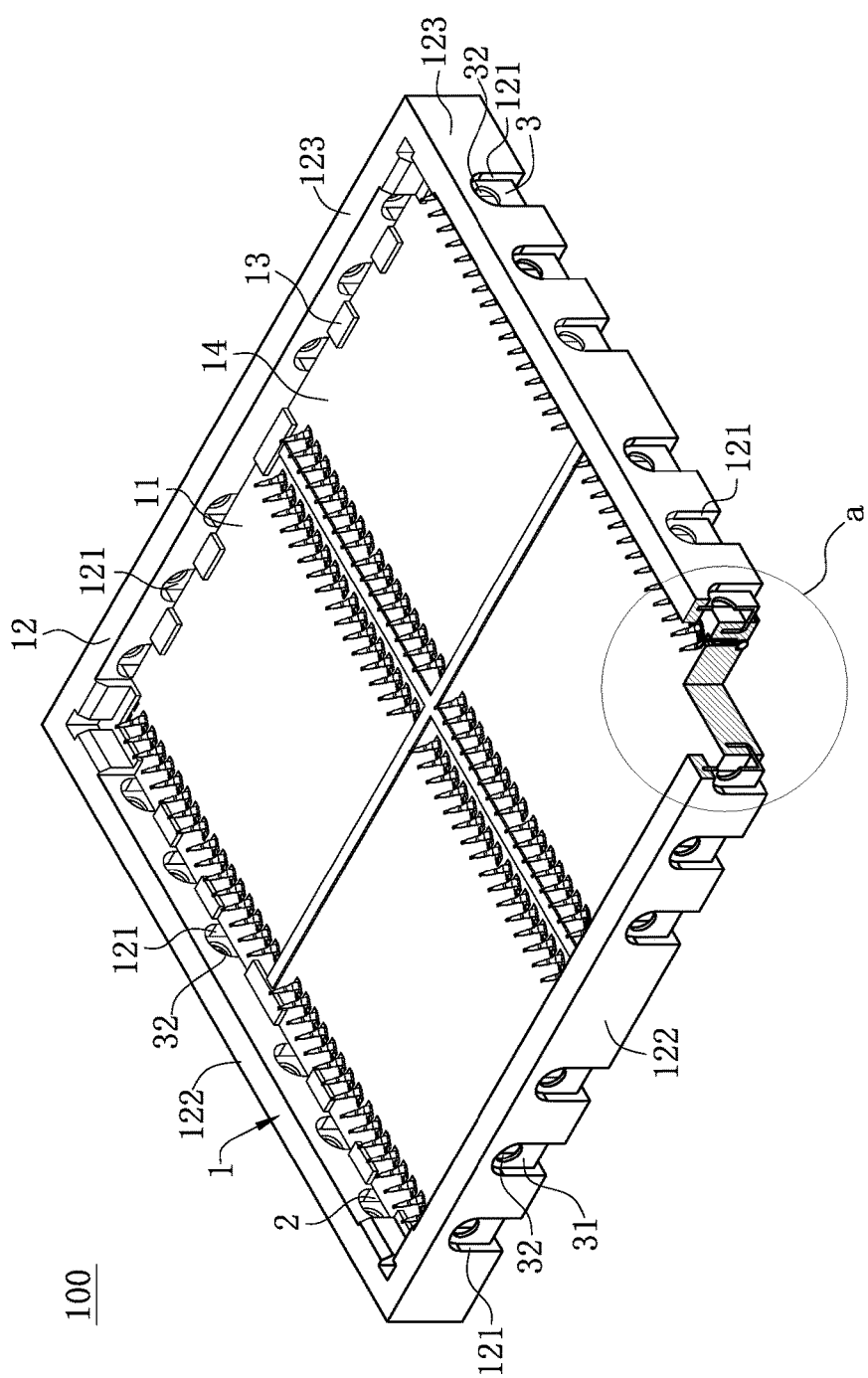
FIG. 2A is a partial sectional view of the electrical connector according to one embodiment of the present invention.
Figure 2B:
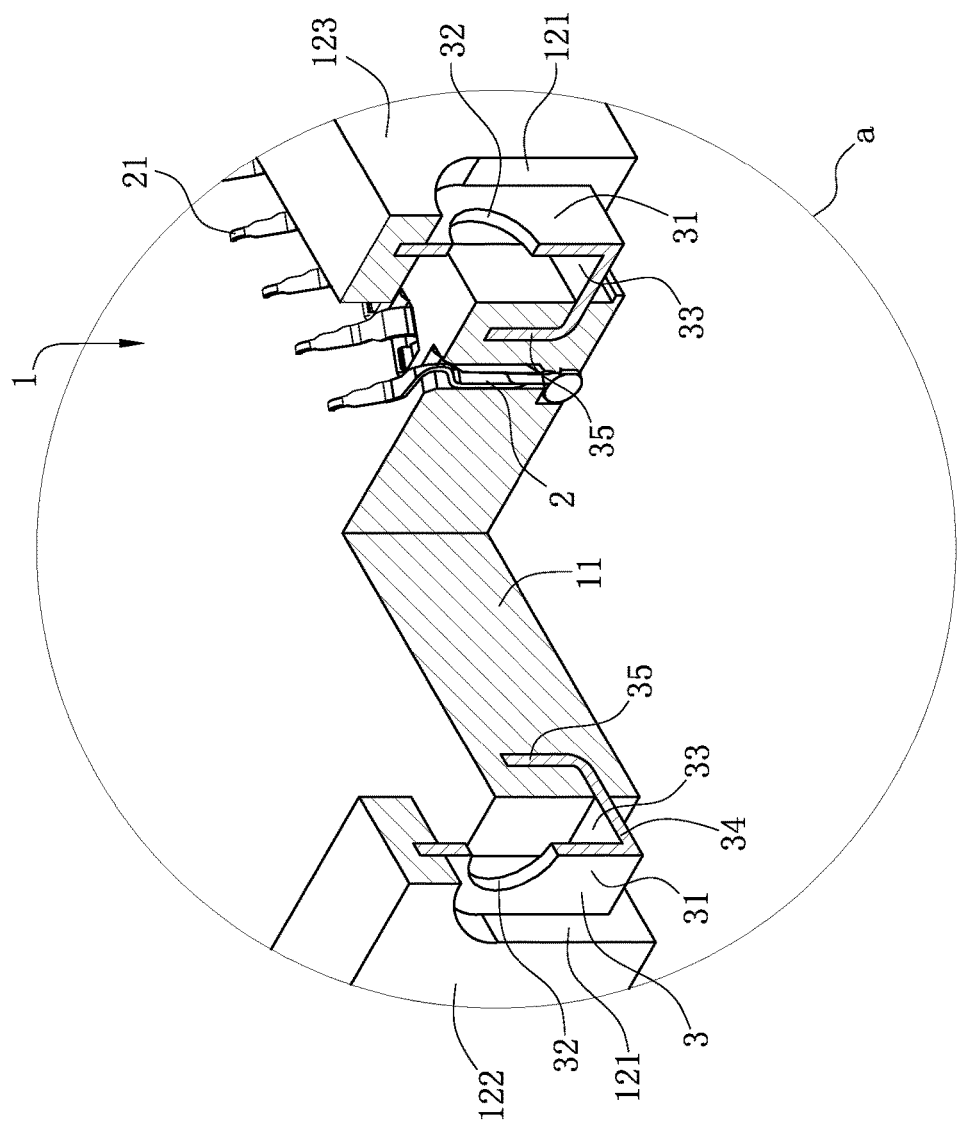
FIG. 2B is an enlarged view of a part a in FIG. 2A.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an electrical connector.

Figure 4:
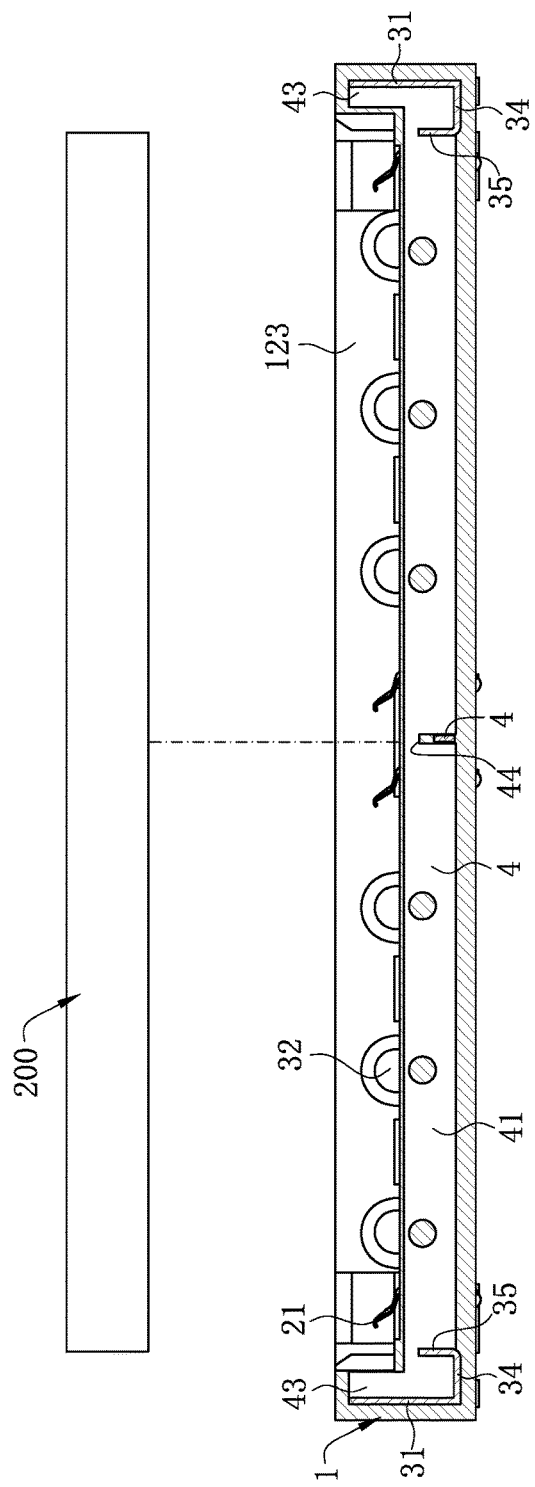
FIG. 4 is a schematic three-dimensional view of the electrical connector mounting a chip module according to one embodiment of the present invention.

As shown in FIG. 1 and FIG. 4, an electrical connector 100 is used for receiving a chip module 200, and includes: an insulating body 1; multiple terminals 2, installed at the insulating body 1; a metal member 3, injection-molded at the insulating body 1; and a reinforcing plate 4, fixedly arranged between two opposite metal members 3.

As shown in FIGS. 1, 2A, 2B and 4, as one of embodiments, the insulating body 1 has a base 11. Four sides of the base 11 are respectively provided with a side wall 12. The side walls 12 are provided with multiple through holes 121. The side walls 12 are higher than the base 11. The base 11 has multiple protruding portions 13 protruding upward at a position adjacent to the side wall 12. The protruding portions 13 are used for upwardly mating the chip module 200. Each of the protruding portions 13 is disposed between two adjacent through holes 121. The protruding portions 13 and the through holes 121 are alternately arranged, and the bottom end of the through hole 121 is lower than the top end of the protruding portion 13. The four side walls 12 are encircled to form an accommodating space 14, and the accommodating space 14 is used for accommodating the chip module 200. The base 11 is provided with multiple receiving slots 111, and multiple terminals 2 are respectively installed in the receiving slots 111. Each terminal 2 has a contacting portion 21. The contacting portion 21 is lower than the top surface of the side wall 12 but higher than the top end of the protruding portion 13, and the contacting portion 21 is used for electrical connection with the chip module 200.

Figure 3:
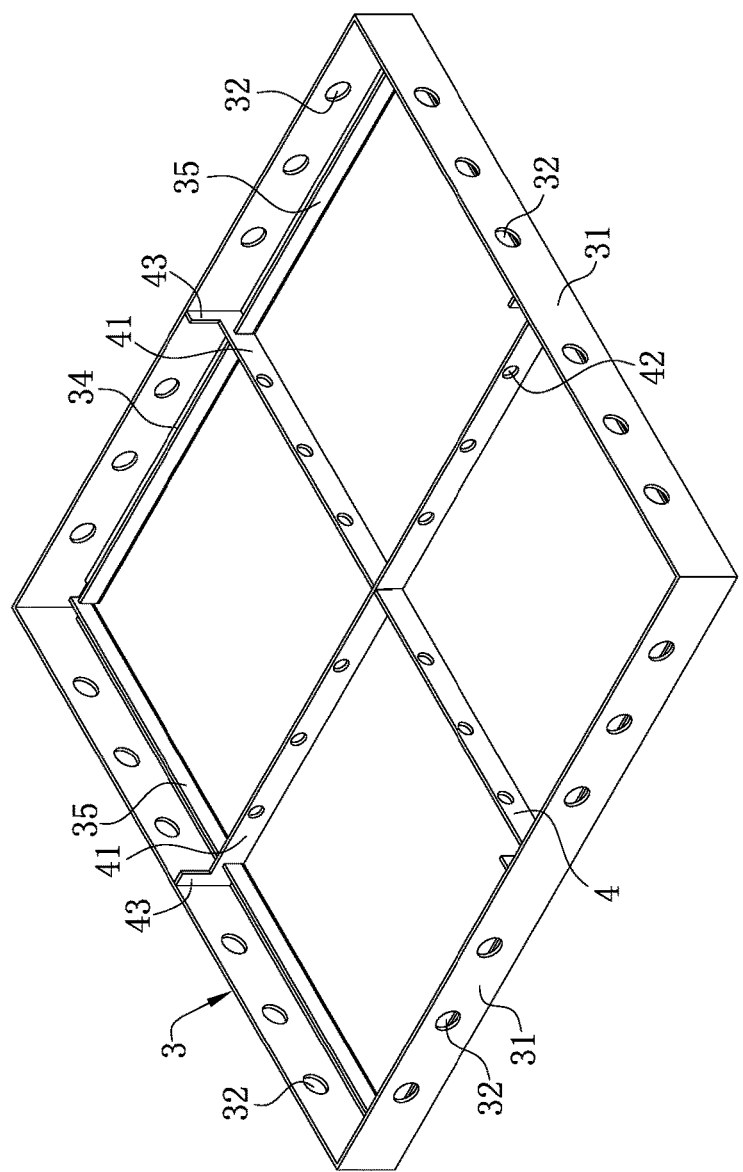
FIG. 3 is a schematic three-dimensional view of a metal member and a reinforcing plate according to one embodiment of the present invention.

As shown in FIGS. 1-3, the four metal members 3 are interconnected in an end-to-end manner and respectively injection-molded in the four side walls 12. Each metal member 3 is provided with a base portion 31. The base portion 31 is provided with multiple via holes 32 corresponding to the through holes 121. When the metal members 3 are injection-molded in the side walls 12, the base portion 31 reserves a clearance 33 between the base 11 and the via holes 32. The base portion 31 is injection-molded at the side wall 12 and extends downward to the base 11, and the base portion 31 bends and extends toward a central direction of the base 11 to form a first bending portion 34. The first bending portion 34 extends beyond the side wall 12 in the horizontal direction and is injection-molded at the base 11. The first bending portion 34 bends upward to form a second bending portion 35 underneath the protruding portion 13. The second bending portion 35 is not higher than the protruding portion 13, and the second bending portion 35 is injection-molded at the base 11.

As shown in FIG. 1 and FIG. 3, the side walls 12 include two first side walls 122 and two second side walls 123, and a reinforcing plate 4 is provided between each of the two first side walls 122 and a corresponding second side wall 123 opposite thereto. The reinforcing plate 4 is provided with a substrate 41, and the substrate 41 is provided with multiple through pores 42. Two sides of the substrate 41 extend upward to form a vertical portion 43. The vertical portion 43 is soldered with the metal member 3, and the vertical portion 43 is not higher than the metal member 3. The middle of each of the two reinforcing plates 4 is provided with a combinational portion 44, and the two reinforcing plates 4 are fixed in an intersecting spliced manner through the combinational portions 44.

Figure 5A:
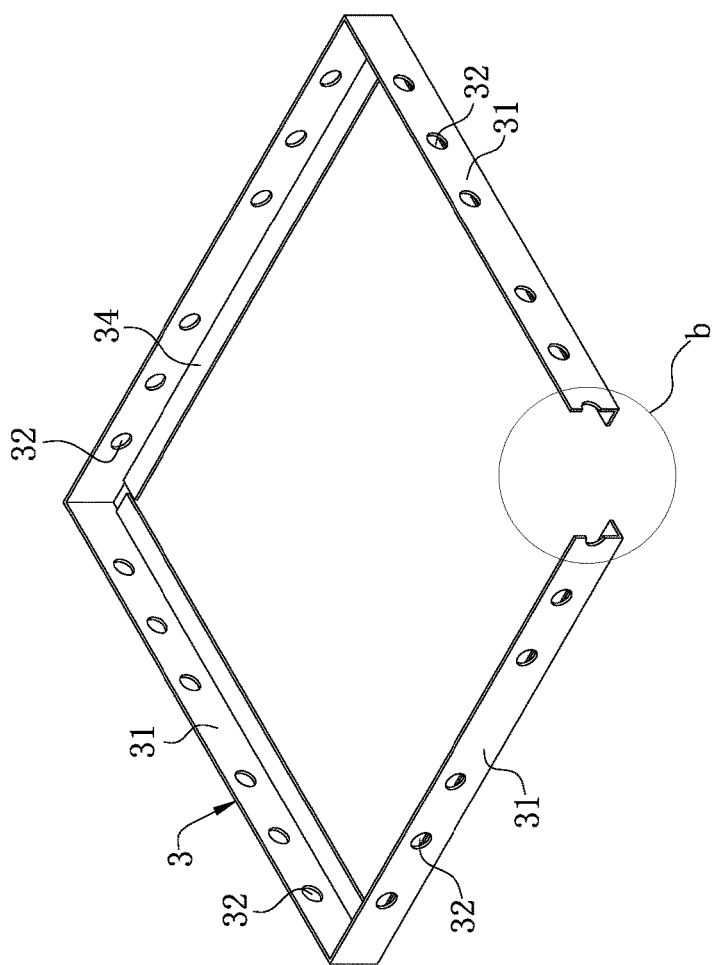
FIG. 5A is a schematic three-dimensional view of a second embodiment of the present invention.
Figure 5B:
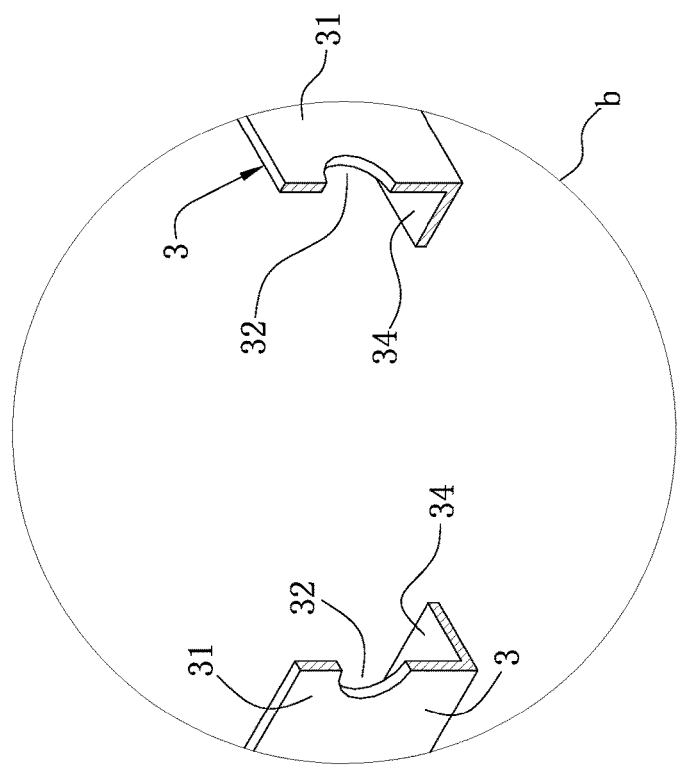
FIG. 5B is an enlarged view of a part b in FIG. 5A.

FIGS. 5A and 5B show a second embodiment of the present invention. The second embodiment differs from the first embodiment in that: the four metal members 3 are encircled into an unity, every two adjacent metal members 3 are soldered with each other, a metal member 3 is provided with a base portion 31, the base portion 31 is provided with multiple via holes 32, and the lower end of the base portion 31 bends and extends toward the central direction to form a first bending portion 34. The metal members 3 are injection-molded at the side walls 12 and the base 11, so as to fix the insulating body 1, and also to prevent warping of the insulating body 1 during high-temperature soldering.

Figure 6A:
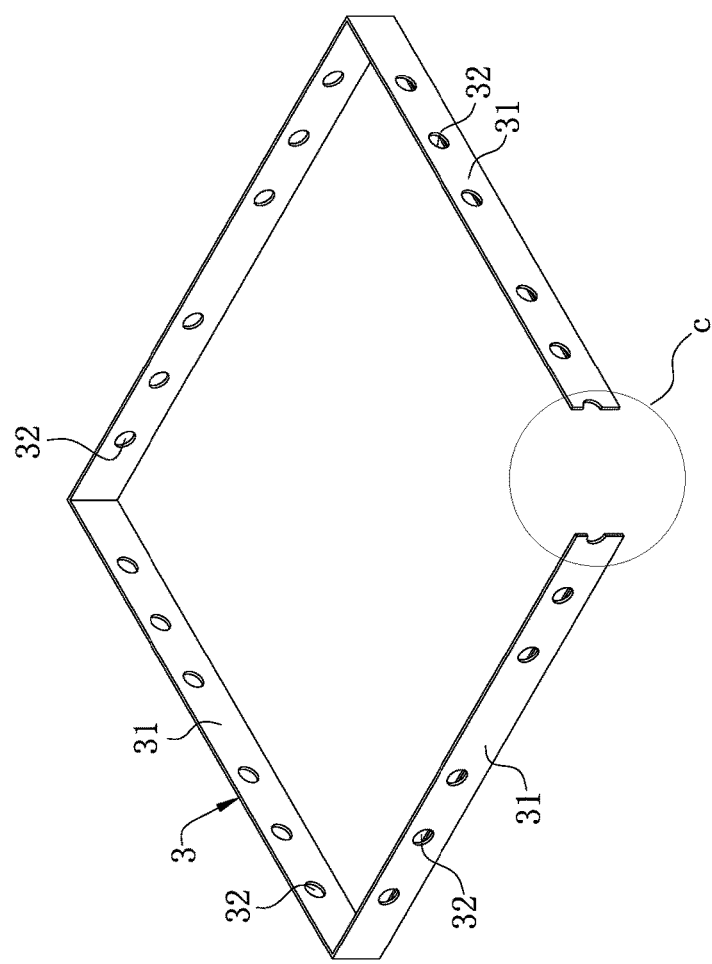
FIG. 6A is a schematic three-dimensional view of a third embodiment of the present invention.
Figure 6B:
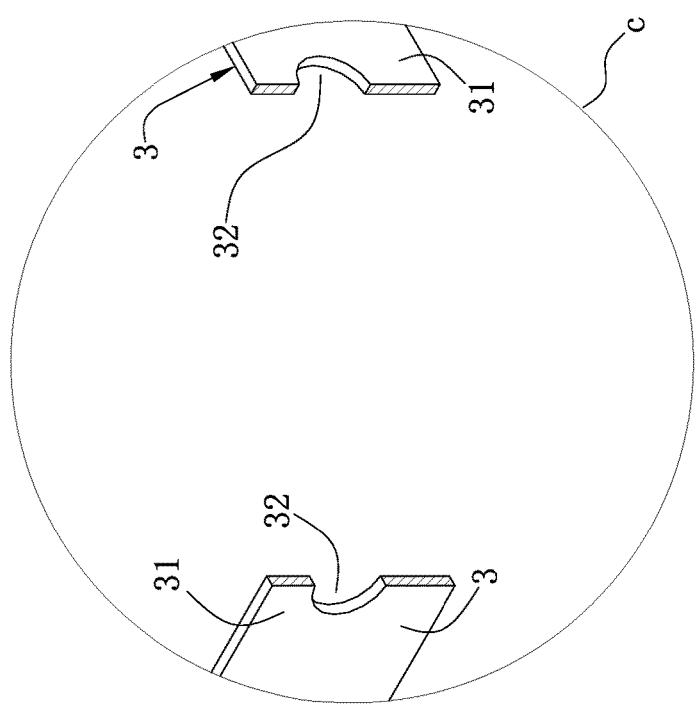
FIG. 6B is an enlarged view of a part c in FIG. 6A.

FIGS. 6A and 6B show a third embodiment of the present invention. The third embodiment differs from the first embodiment in that: the metal members 3 are of straight-plate structures, the four metal members 3 are encircled into an unity, every two adjacent metal members 3 are soldered with each other, the metal member 3 is provided with a base portion 31, and the base portion 31 is provided with multiple via holes 32. The metal members 3 are injection-molded at the side walls 12 and the base 11, so as to fix the insulating body 1, and also to prevent warping of the insulating body 1 during high-temperature soldering.

Figure 7:
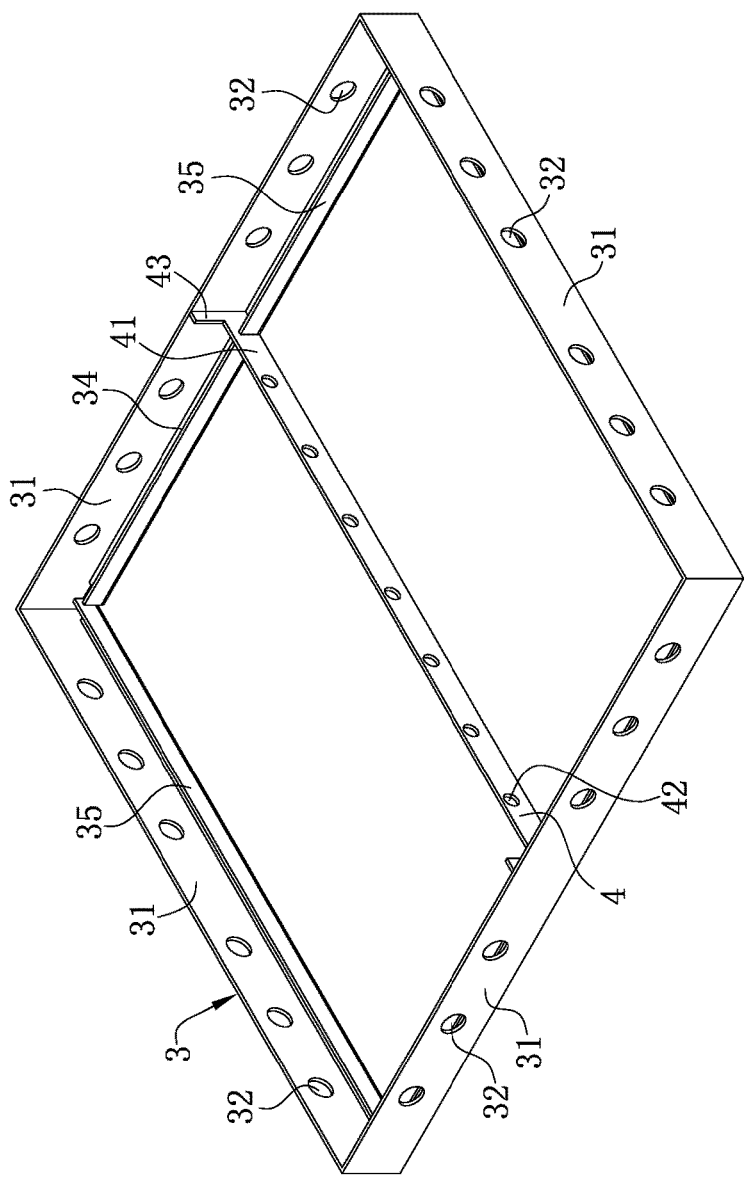
FIG. 7 is a schematic three-dimensional view of a fourth embodiment of the present invention.

FIG. 7 shows a fourth embodiment of the present invention. The fourth embodiment differs from the first embodiment in that: four metal members 3 are encircled into an unity, every two adjacent metal members 3 are soldered with each other, a reinforcing plate 4 is only provided between one metal member 3 and another metal member 3 opposite thereto, the reinforcing plate 4 is provided with a substrate 41, and the substrate 41 is provided with multiple through pores 42. Two sides of the substrate 41 extend upwardly to form a vertical portion 43, the vertical portion 43 is soldered with the metal members 3, and the vertical portion 43 is not higher than the metal members 3. The metal members 3 and the reinforcing plate 4 are injection-molded at the side walls 12 and the base 11, so as to fix the insulating body 1, and also to prevent warping of the insulating body 1 during high-temperature soldering.

Figure 8A:
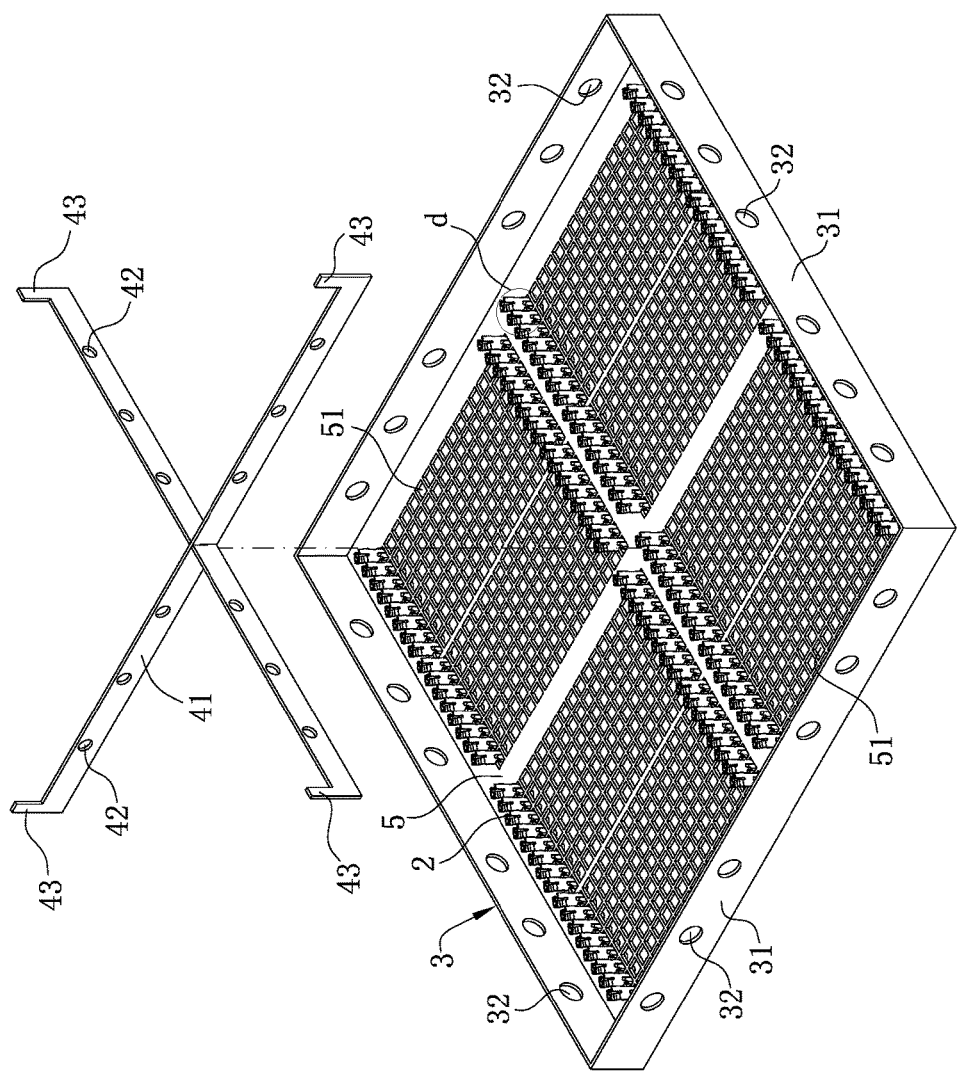
FIG. 8A is a schematic three-dimensional view of a fifth embodiment of the present invention.

FIGS. 8A and 8B show a fifth embodiment of the present invention. The fifth embodiment differs from the first embodiment in that: four metal members 3 are interconnected and respectively injection-molded in four side walls 12. Each metal member 3 is provided with a base portion 31, the base portion 31 is provided with multiple via holes 32 corresponding to the through holes 121, the base portion 31 reserves a clearance 33 between the base 11 and the via holes 32, the base portion 31 is injection-molded at the side walls 12 and extends downwardly to the base 11, the base 11 is provided with a bottom plate 5 therein, and the bottom plate 5 is injection-molded at the base 11 and provided with multiple reserved holes 51 corresponding to the receiving slots 111. The metal members 3 are circumferentially arranged on the four sides of the bottom plate 5 and soldered with the bottom plate 5. The metal members 3 and the bottom plate 5 are injection-molded at the side walls 12 and the base 11, thus playing a same role in fixing the insulating body 1, so as to fix the insulating body 1, and also to prevent warping of the insulating body 1 during high-temperature soldering.

Compared with the related art, the electrical connector 100 according to certain embodiments of the present invention has the following beneficial advantages:

1. The side wall 12 is provided with the through holes 121, the metal member 3 is provided with multiple via holes corresponding to the through holes 121, when the insulating body 1 is placed into a soldering furnace to be soldered at a high temperature, the through holes 121 and the via holes 32 can circulate the air so as to dissipate the heat of the insulating body 1, and the contact condition of the chip module 200 and the terminals 2 can be observed through the through holes 121 and the via holes 32.

2. The protruding portion 13 is arranged between two adjacent via holes 32, so as to not only support the chip module 200, but also to prevent the protruding portion 13 from blocking the via hole 32 and resulting in deterioration of the heat dissipation effect.

3. The side wall 12 is higher than the boss 13, so that the chip module 200 can be limited in the insulating body 1.

4. The bottom end of the through hole 121 is lower than the top end of the protruding portion 13, thereby increasing a heat dissipation range of the through hole 121, and improving the heat dissipation effect.

5. The base portion 31 bends and extends to form the first bending portion 34, the first bending portion 34 bends and extends upwardly to form the second bending portion 35, and the first bending portion 34 and the second bending portion 35 are injection-molded at the base 11, thereby improving the effect of the metal members 3 for fixing the insulating body 1.

6. The reinforcing plate 4 is disposed between the first side wall 122 and the second side wall 123 and interconnected with the metal members 3, so that the reinforcing plate 4 can fix the base 11, and the base 11 can be prevented from warping due to the heating.

7. The substrate 41 is provided with multiple through pores 42, and when the reinforcing plate 4 is injection-molded at the base 11, plastic materials can flow through the through pores 42, thereby facilitating the molding of the base 11, and improving the fixing effect of the reinforcing plate 4 and the base 11.

8. Two sides of the substrate 41 extend upwardly to form a vertical portion 43, the vertical portion 43 is soldered with the metal member 3, thereby reinforcing the connection between the reinforcing plate 4 and the metal member 3, and preventing the reinforcing plate 4 from being separated from the metal member 3.

9. Multiple metal members 3 are connected together to allow the metal members 3 to form a whole body, thereby improving the effect of the metal members 3 for fixing the side walls 12.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for being electrically connected to a chip module, comprising:
    an insulating body having a base and a plurality of side walls surrounding the base, wherein the base is provided with a plurality of receiving slots, a height of the side walls is greater than a height of the base, and the side walls are encircled to form an accommodating space for accommodating the chip module;
    a plurality of terminals respectively received in the receiving slots, wherein each of the terminals has a contacting portion, a top most portion of each of the contacting portions are disposed lower than a top surface of the side walls and are used for electrically connecting the chip module and;
    at least one metal member, injection molded at the base and the side walls.

2. The electrical connector of claim 1, wherein the side walls is provided with a plurality of through holes, and the at least one metal member is provided with a plurality of via holes corresponding to the through holes.

3. The electrical connector of claim 2, wherein the base comprises a plurality of protruding portions protruding upward from a position adjacent to the side walls for urging the chip module upward, and each of the protruding portions is disposed between adjacent two of the via holes.

4. The electrical connector of claim 3, wherein the height of the side walls is greater than a height of the protruding portions.

5. The electrical connector of claim 3, wherein bottom ends of the through holes are located lower than top ends of the protruding portions.

6. The electrical connector of claim 1, wherein the at least one metal member comprises a base portion injection molded at the side walls and extended to the base, a first bending portion is formed by bending and extending from the base portion, and the first bending portion is injection molded at the base.

7. The electrical connector of claim 6, wherein the at least one metal member further comprises a second bending portion formed by bending and extending upward from the first bending portion and corresponding to lower sides of the protruding portions, and the second bending portions are injection molded at the base.

8. The electrical connector of claim 1, wherein the side walls comprise a first side wall and a second side wall arranged opposite to each other, a reinforcing plate is disposed between the first side wall and the second side wall, and the reinforcing plate is connected with the at least one metal member.

9. The electrical connector of claim 8, wherein the reinforcing plate comprises a substrate, and the substrate is provided with a plurality of through pores.

10. The electrical connector of claim 9, wherein a number of the first side walls and the second side walls is two, a number of the reinforcing plate is one, and the reinforcing plate is provided between one of the two first side walls and corresponding one of the two second sidewalls.

11. The electrical connector of claim 9, wherein a number of the first side walls and the second side walls is two, a number of the reinforcing plate is two, each of the two reinforcing plates is provided between corresponding one of the two first side walls and corresponding one of the two second side walls, and the two reinforcing plates intersect and splice each other to be fixed with each other.

12. The electrical connector of claim 9, wherein each of two sides of the substrate extends upward to form a vertical portion, and the vertical portions are soldered to the at least one metal member.

13. The electrical connector of claim 1, the at least one metal member comprises a plurality of metal members interconnected with one another, and the metal members are injection molded at the side walls.

14. The electrical connector of claim 1, further comprising a bottom plate injection molded at the base, wherein the bottom plate is provided with a plurality of reserved holes corresponding to the receiving slots.

15. The electrical connector of claim 14, wherein the bottom plate and the metal members are integrally formed.

* * * * *